LOW VOLTAGE-LOW POWER MONOSTABLE MULTIVIBRATOR

Filed Dec. 20, 1966

INVENTOR
Olaf R. Ryerson
BY Dean Sandow
ATTORNEY

United States Patent Office 3,488,513

Patented Jan. 6, 1970

3,488,513

LOW VOLTAGE-LOW POWER MONOSTABLE MULTIVIBRATOR

Olaf R. Ryerson, Laurel, Md., assignor to Westinghouse Electric Corporation, Pittsburgh, Pa., a corporation of Pennsylvania Filed Dec. 20, 1966, Ser. No. 603,307

Int. Cl. H03k *3/26, 17/00, 3/10*

U.S. Cl. 307—273 6 Claims

ABSTRACT OF THE DISCLOSURE

A monostable multivibrator having first and second opposite conductivity transistors and third and fourth opposite conductivity transistors cross connected for multivibrator action. A fifth transistor has its collector electrode connected to the base electrode of the second transistor and its emitter electrode connected to a source of input pulses for turning on the second transistor to initiate transition to an unstable state of operation, the duration of which is controlled by an RC timing network.

This invention in general relates to logic circuits, and in particular, to a low voltage, low power monostable multivibrator circuit.

Monostable multivibrators generally include two active elements such as transistors, cross coupled in a manner that one of the transistors is normally off while the other is normally on. This condition of the transistors is known as the stable state and may represent a binary zero. With the application of a proper input signal, the transistors may be made to reverse their condition thereby switching the multivibrator into an unstable condition for a period of time governed by a resistance-capacitance timing network, and after which the transistors revert back to their initial or stable state.

The monostable multivibrator finds many applications in digital circuitry for use in providing time delay pulses, for standardizing pulses with respect to pulse width, for gating operations to provide predetermined gating pulses and for pulse stretchers, to name a few.

A prime consideration in the field of integrated circuitry is power dissipation and conventional circuits in integrated form are designed for low power dissipation. However, for conventional monostable multivibrators a minimum of several volts for the supply voltage is required in order to maintain proper and desirable operating characteristics.

It is therefore one object of the present invention to provide a monostable multivibrator circuit which is operable at much lower voltages than heretofore.

Another object is to provide a low voltage monostable multivibrator circuit wherein power dissipation is minimal.

Another object is to provide a monostable multivibrator circuit which is operable with supply voltages in the order of 1 volt.

In monostable multivibrators the resistor R and capacitor C of the timing network determines the pulse width and to provide a wider pulse width it is necessary to increase the RC time constant by increasing the resistor and/or capacitor value. When fabricated in integrated circuit form, this necessitates the use of larger areas on the semiconductor chip thereby increasing its basic size.

Another object of the present invention therefore is to provide a monostable multivibrator circuit adapted to be made in integrated circuit form and wherein for the same value of resistor and capacitor of the timing circuit as in prior art circuits, a wider pulse width is obtainable.

Briefly in accordance with the above objects, there is provided four transistors in conjunction with circuit means for connecting and coupling the transistors, for monostable multivibrator action wherein during the stable state the first and fourth transistors are on while the second and third transistors are off and during the unstable state the second and third transistors are on while the first and fourth transistors are off. The primary element for allowing the multivibrator to act at extremely low power supplies is a fifth transistor in conjunction with a source of input trigger pulses for turning on the fifth transistor only when supplied with a trigger pulse. The fifth transistor is connected to one of the previously mentioned transistors, preferably the second, for turning on the second transistor when the fifth transistor turns on for initiating a transition to the unstable state.

Other features of the invention as well as further objects and advantages will become apparent upon a reading of the following detailed specification taken in conjunction with the drawings, in which.

Figure 1:
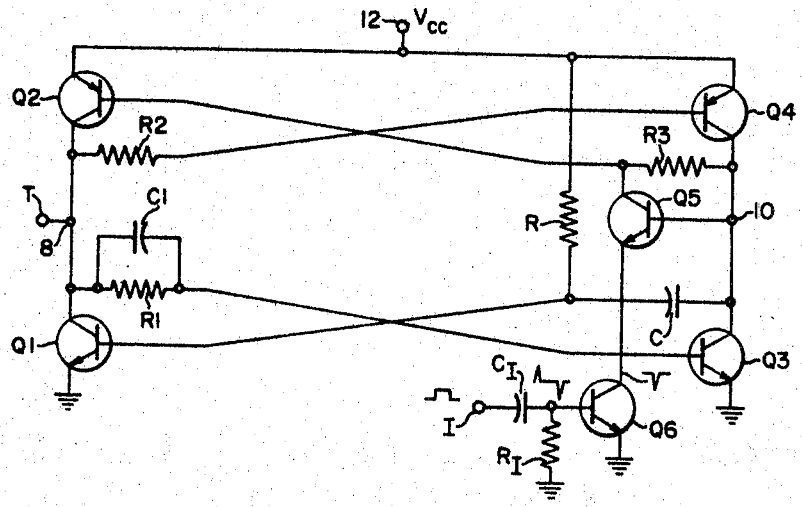
FIGURE 1 illustrates a circuit in accordance with the present invention.

Referring now to FIGURE 1, there is illustrated a monostable multivibrator circuit including four transistors Q1, Q2, Q3, and Q4 interconnected for monostable multivibrator action. Transistors Q1 and Q2 of opposite conductivity types have their collectors commonly connected to a first junction point 8 to which is connected an output terminal T. Similarly, opposite conductivity type-transistors Q3 and Q4 have their collectors commonly connected to a second junction point 10. The emitters of the transistors Q2 and Q4 are connected to terminal 12 to which may be applied a source of operating potential $V_{cc}$, and the emitters of transistors Q1 and Q3 are connected to a source of reference potential illustrated as ground. Resistors R2 and R3 connect the bases of transistors Q4 and Q2 to junction points 8 and 10 respectively; the junction points are also the collector reference points of transistors Q1 and Q3. The base of transistor Q3 is connected to the collector of transistor Q1 by the parallel arrangement of the resistor R1 and capacitor C1, and for monostable action the base of transistor Q1 is connected to the collector of transistor Q3 by an AC coupling device in the form of timing capacitor C. The RC timing circuit is completed by the provision of resistor R connected between the base of transistor Q1 and voltage supply terminal 12.

Low voltage operation may be accomplished with the provision of a fifth transistor Q5 in conjunction with a source of input trigger pulses for turning on the fifth transistor to initiate a transition to the unstable state. The base of transistor Q5 is connected to the second junction point 10 and its collector-emitter current path is connected with the emitter-base current path of transistor Q2. The emitter of transistor Q5 is connected to the collector of transistor Q6 which when turned on forms a path to ground for the emitter current of transistor Q5. When the input pulse, as illustrated, is applied to input terminal I it is differentiated by capacitor $C_I$ in conjunction with resistor $R_I$ so that a positive going and then a negative going spike is provided to the base of transistor Q6 which turns on in response to the positive going input spike.

In operation, and assuming a 1 volt supply voltage, transistors Q1 and Q4 are on such that the emitter-base current of transistor Q4 forms the collector current of transistor Q1, the base current of which is derived from the supply through resistor R. The voltage drop across an on saturated transistor is a function of many variables and for purposes of explanation it will be assumed to be 0.06 volt. Accordingly, the transistor Q1 which is on holds the voltage level at terminal T at 0.06 volt and the voltage at junction 10 is 0.94 volt. When an input signal is applied to input terminal I transistor Q6 turns on, turning on transistor Q5 which has the effect of drawing base current from transistor Q2 to turn it on. As transistor Q2 turns on, the voltage at its collector rises toward the supply and the rise in voltage is coupled through capacitor C1 to the base of Q3 tending to turn it on. As transistor Q3 turns on, its collector experiences a drop in voltage which in turn is coupled to the base of transistor Q1 tending to drive it into its cut-off condition.

After the transistion to the unstable state, transistors Q1 and Q4 are off and transistors Q2 and Q3 are conducting. During the unstable state, current in the RC timing circuit builds up a charge on the capacitor C and when the voltage build-up equals the base-emitter diode voltage drop of transistor Q1, transistor Q1 will turn on with a consequent drop in collector voltage, which coupled to the base of transistor Q3 tends to turn it off which tends to turn Q2 off, thus concluding the transition back to the stable state. Therefore it is seen that the initial switch to the unstable state is governed by the momentary turning on of transistor Q5 and the duration in the unstable state is governed by the RC timing network.

Figure 2:
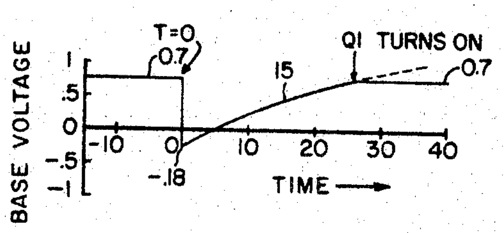
FIGS. 2 and 3 illustrate waveforms demonstrating the increased period obtained with the low voltage supply of the circuit of FIG. 1 as compared to a circuit operating at slightly higher supply voltages.

One effect of the lower supply voltage allowed by the provision of transistor Q5 in conjunction with the source of input trigger signals may be seen in FIG. 2. The curve of FIG. 2 illustrates the base voltage of transistor Q1 just prior to, during, and after the time that transistor Q5 momentarily turns on. Prior to time T=0 the voltage at the base of transistor Q1 is approximately 0.7 volt, assuming a silicon transistor, although this specific voltage may vary. At time T=0, transistor Q5 is turned on to effect a switching of transistor Q3 to an on condition. Just prior to switching the voltage at the collector of transistor Q3 was, in the example given, 0.94 volt. When transistor Q3 turns on, the collector voltage drops to 0.06 volt, representing a 0.88 voltage difference. The decrease in 0.88 volt at the collector of transistor Q3 is coupled through the capacitor C to the base of transistor Q1, which from a voltage of 0.7 volt, decreases 0.88 volt to —0.18 volt as indicated in FIG. 2. At this point transistor Q5 has turned off and the transition to the unstable state has taken place. During the unstable state the charge on capacitor C builds up toward the 1 volt supply, as represented by the exponential curve 15. When the 0.7 threshold point of turning on transistor Q1, is reached, transistor Q1 turns on and clamps the voltage at the 0.7 point. With an RC time constant of 20 microseconds and a supply voltage of 1 volt it may be mathematically demonstrated that Q1 will turn on approximately 27.4 microseconds after time T=0; in other words, the period or the time that the circuit remains in the unstable state is in the order of 27.4 microseconds.

Figure 3:
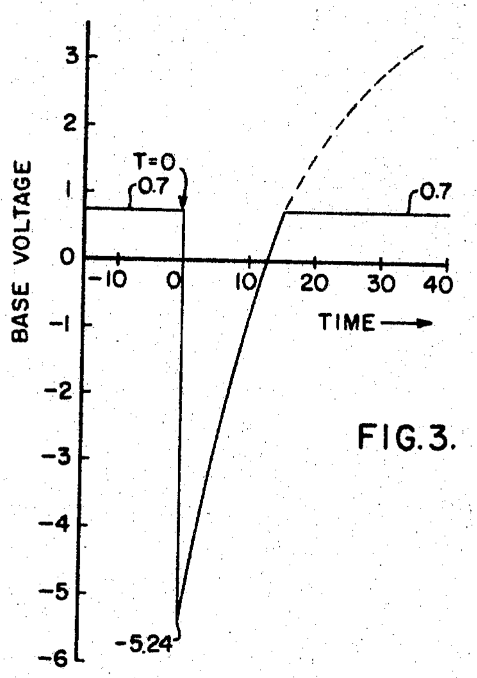

In FIG. 3, the analysis of FIG. 2 is applied to a conventional multivibrator circuit having a normally on transistor and a normally off transistor cross-coupled for monostable multivibrator action and having a supply voltage for example in the order of 6 volts. It may be demonstrated that for the same RC time constant as in FIG. 2, a shorter period results. This may be seen by reference to FIG. 3 which represents the base voltage of the normally on transistor of a conventional multivibrator. Assuming the same transistor voltage drops as in FIG. 2, it is seen that just prior to time T=0 the base voltage of the normally on transistor is 0.7 volt. Just after time T=0 a transition to the unstable state takes place and assuming that with a 6 volt supply, the collector electrode of the normally off transsitor was at 6 volts, and just after transistor drops to 0.06 volt, A total voltage change of 5.94 volts is coupled to the base of the normally on transistor which therefore drops the voltage of the base down to —5.24 volts. The exponential curve rising toward the 6 volt supply as determined by the RC time constant, turns the normally on transistor on once again when the 0.7 volt level is reached and it may be mathematically shown that with a 6 volt supply and an RC time constant of 20 microseconds (as in FIG. 2) the period of a conventional monostable multivibrator is approximately 15 microseconds as compared with 27.4 microseconds of FIG. 2.

The fabrication of the circuit of FIG. 1 in integrated circuit form allows longer unstable periods for the same value of RC time constant of a conventional circuit. This feature allows a reduction in size of the resistance and/or capacitor value of the RC timing circuit. In addition transistor Q5 allows the transition to the unstable state to commence with a high degree of reliability and is compatible with current technology for producing NPN-PNP transistors on a single semiconductor chip.

Although the present invention has been described with a certain degree of particularly, it should be understood that the present disclosure has been made by way of example, and that modifications and variations of the present invention are made possible in the light of the above teachings.

What is claimed is:

1. A low voltage multivibrator circuit comprising:

(A) first and second transistors having commonly connected collector electrodes;

(B) third and fourth transistors having commonly connected collector electrodes;

(C) circuit means for connecting and coupling said transistors for monostable multivibrator action wherein during the stable state said first and fourth transistors are on and said second and third transistors are off, and during the unstable state said second and third transistors are on and said first and fourth transistors are off;

(D) a fifth transistor;

(E) a source of input trigger pulses for turning on said fifth transistor only when supplied with a trigger pulse;

(F) said fifth transistor having a collector electrode connected to the base electrode of said second transistor, an emitter electrode connected to said source of input trigger pulses and a base electrode connected to the commonly connected collector electrodes of said third and fourth transistors for turning on said second transistor when said fifth transistor turns on, for initiating a transition to the unstable state.

2. Circuitry according to claim 1 which additionally includes:

(A) terminal means for connection to a source of operating potential; and wherein (B) the collector electrodes of the first and second transistors are commonly connected to a first junction point;

(C) the emitter electrodes of the first and second transistors are connected to a reference potential and to said terminal means respectively;

(D) the collectors of the third and fourth transistors are commonly connected to a second junction point;

(E) the emitter electrodes of the third and fourth transistors are connected to a reference potential and said terminal means respectively;

(F) the bases of said first and second transistors are connected to said second junction point;

(G) the bases of the third and fourth transistors are connected to said first junction point, and wherein the circuit means includes (H) an RC timing circuit having a resistor connected between said terminal means and the base of said first transistor.

3. Circuitry according to claim 1 wherein:

(A) the fifth transistor and the second transistor are of opposite conductivity types.

4. Circuitry according to claim 2 wherein:

(A) the collector of the fifth transistor is directly connected to the base of the second transistor.

5. Circuitry according to claim 2 wherein:

(A) the collector potential of the third transistor biases the base of the fifth transistor.

6. Circuitry according to claim 1 wherein:

(A) the source of input trigger pulses includes a sixth transistor and wherein (B) the collector-emitter current path of said sixth transistor is in series with the collector-emitter current path of the fifth transistor.

References Cited

UNITED STATES PATENTS

| | | | |
|---|---|---|---|
| 2,948,820 | 8/1960 | Bothwell | 307—273 |
| 3,010,031 | 11/1961 | Baker | 307—292 |

DONALD D. FORRER, Primary Examiner

J. D. FREW, Assistant Examiner

U.S. Cl. X.R.

307—247; 328—207